United States Patent
Kotowski et al.

(10) Patent No.: US 6,351,360 B1
(45) Date of Patent: Feb. 26, 2002

(54) APPARATUS FOR SELECTIVE SHUTDOWN OF DEVICES OF AN INTEGRATED CIRCUIT IN RESPONSE TO THERMAL FAULT DETECTION

(75) Inventors: Jeff Kotowski, Nevada City; James C. Schmoock, Granite Bay; John P. Parry, Grass Valley, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/399,509

(22) Filed: Sep. 20, 1999

(51) Int. Cl.$^7$ ................................................. H02H 5/04
(52) U.S. Cl. ........................ 361/103; 361/93.8; 361/24; 361/100; 361/106; 713/300
(58) Field of Search ................................ 361/103, 93.8, 361/24, 100, 106; 713/300

(56) References Cited

U.S. PATENT DOCUMENTS

| | | | | |
|---|---|---|---|---|
| 5,001,593 A | * | 3/1991 | Zitta et al. .................... | 361/103 |
| 5,550,702 A | | 8/1996 | Schmidt et al. .............. | 361/103 |
| 5,615,077 A | | 3/1997 | Takizawa et al. ............ | 361/103 |
| 5,758,171 A | | 5/1998 | Ramamurthy et al. . | 395/750.01 |
| 6,052,268 A | * | 4/2000 | Thomas ........................ | 361/103 |
| 6,222,716 B1 | * | 4/2001 | Chiang et al. ................ | 361/103 |

OTHER PUBLICATIONS

"MIC2525 USB Power Control Switch Preliminary Information," pp. 1–12, Micrel, Inc., Dec. 1998.
"TPS202x/3x and TPS204x/5x USB Power Distribution Application Report," Daniels, David G., Texas Instruments, 14 pages (SLVA049—Oct. 1998).
"TPS2044, TPS2054 Quad Power–Distribution Switches," Texas Instruments Data Sheet, pp. 1–10 and 18 (SLVS174B—Jul. 1998—revised Feb. 1999).
"TPS2042, TPS2052 Dual Power–Distribution Switches," Texas Instruments Data Sheet, pp. 1–2 (SLVS173A—Aug. 1998—revised Apr. 1999).

* cited by examiner

*Primary Examiner*—Fritz Fleming
*Assistant Examiner*—Miguel A. Quinones
(74) *Attorney, Agent, or Firm*—Girard & Equitz LLP

(57) ABSTRACT

An integrated circuit including one or more power devices, and circuitry which reliably (and independently) shuts down each power device that is detected to be in an undesired operating condition (e.g., one or both of an overcurrent condition and an overvoltage condition) that causes a thermal fault, but which does not shut down any power device that is not in such undesired operating condition. In typical implementations in which the integrated circuit has multiple power devices and an overvoltage detection circuit for each power device, the integrated circuit includes a thermal fault detection circuit and logic circuitry which receives the output of the thermal fault detection circuit and each overvoltage detection circuit. The logic circuitry generates signals which shut down appropriate ones of the power devices in response to the thermal fault detection and overvoltage detection signals it receives. The integrated circuit also includes fail safe thermal shutdown circuitry which shuts down all power devices upon detecting a more severe thermal fault even when no overcurrent or overvoltage condition is detected. In some embodiments, when a thermal fault is detected, each power device that is in an overcurrent and/or overvoltage condition (but none of the power devices that is in neither an overcurrent nor an overvoltage condition) is shut down. All the power devices are shut down upon detection of a more severe thermal fault even when no overcurrent or overvoltage condition is detected.

16 Claims, 5 Drawing Sheets

$$I_{load} = \frac{V_{sense}}{R}$$

APPARATUS FOR SELECTIVE SHUTDOWN OF DEVICES OF AN INTEGRATED CIRCUIT IN RESPONSE TO THERMAL FAULT DETECTION

FIELD OF THE INVENTION

The invention relates generally to methods and apparatus for implementing thermal shutdown of power devices of integrated circuits. More specifically, the invention relates to methods and apparatus for selectively shutting down a power device of an integrated circuit when the power device has an overcurrent (or overvoltage) condition that causes a thermal fault.

DESCRIPTION OF THE RELATED ART

Thermal shutdown circuits are frequently used with power devices to prevent damage to (or destruction of) the power devices under extreme temperature conditions, by shutting down the power devices in response to detecting a thermal fault.

The expression "thermal fault" is used herein to denote an extreme temperature condition (temperature in excess of a predetermined threshold temperature). The expression "power device" is used herein to denote electrical circuitry, or a component (e.g., transistor) of electrical circuitry, that is used to deliver power. During typical operation of a power device, substantial current flows through the device and the device can reach an undesirably high temperature (e.g., due to defects introduced into the device during manufacture, or to assertion of signals of unusual magnitude to the device during operation).

For example, in the conventional integrated circuit of FIG. 1, the output of circuitry 1 (produced in response to input signal IN) is coupled to a first input of OR gate 3. The output of OR gate 3 is coupled to the gate of P-channel MOSFET transistor Pi. The drain of transistor PI is coupled to output node OUT. Thus, when the second input of gate 3 is at a logical "0", the level of output node OUT is determined by the level of the output signal asserted from circuitry 1 to the first input of gate 3. Circuit 2 comprises P-channel MOSFET transistor P1 (connected as shown in FIG. 1) and circuitry 1 (connected as shown). Circuitry 1 typically includes (but need not include) one or more power devices, and is configured to receive input signal IN and assert in response an output signal to the first input of OR gate 3. In a conventional implementation of thermal shutdown circuitry, the integrated circuit of FIG. 1 includes thermal shutdown circuit 4 which asserts a voltage signal (indicative of a logical "1") to the second input of OR gate 3 (to cause transistor P1 to turn off) when the temperature at thermal shutdown circuit 4 increases to a threshold temperature (e.g., 170 degrees Celsius).

It is known to implement a thermal shutdown circuit (e.g., thermal shutdown circuit 4 of FIG. 1) using a bipolar transistor, with the voltage ($V_{BE}$) between the base and emitter of the bipolar transistor allowed to drift in response to variations in the bipolar transistor's temperature. When the voltage $V_{BE}$ increases (or decreases) to a level that corresponds to the thermal shutdown threshold temperature, the bipolar transistor turns on, thereby generating a signal which is asserted by the thermal shutdown circuit to cause power devices on the chip to shut down.

When an integrated circuit includes two or more power devices but only one thermal shutdown circuit, the thermal shutdown circuit cannot reliably determine which (if any) of the power devices is generating excessive heat (due to thermal crosstalk), and thus cannot independently shut down individual ones of the power devices that are generating excessive heat while allowing the others to continue to operate.

Even when an integrated circuit includes multiple power devices, and multiple thermal shutdown circuits (each thermal shutdown circuit positioned on the chip close to a different one of the power devices), thermal crosstalk typically prevents the thermal shutdown circuits from reliably determining which (if any) of the power devices is generating excessive heat. Thus, the thermal shutdown circuits cannot independently shut down an individual one of the power devices that is generating excessive heat (or individual ones of the power devices that are generating excessive heat) while allowing the others to continue to operate. For example, a thermal fault of prolonged duration (due to excessive heat generation at one of several power devices on a chip) will heat the entire die, causing all the thermal shutdown circuits to detect a thermal fault, with the result that the thermal shutdown circuits will shut down all the power devices.

It is well known to include an overcurrent (and/or overvoltage) shutdown circuit in an integrated circuit that includes a power device, to prevent destruction of the power device by shutting it down (or limiting the current through it) in response to detecting one or both of an overcurrent condition (in which the power device draws current in excess of a current threshold) and an overvoltage condition (in which a node of the power device reaches a potential above a threshold value).

However, until the present invention it had not been known how to implement an integrated circuit (including one or more power devices) with circuitry configured to reliably (and independently) shut down (or limit the current through) each individual power device having an overcurrent (and/or overvoltage) condition that causes a thermal fault (resulting in temperature above a threshold temperature). Nor had it been known how to implement such an integrated circuit so as to be capable of reliably shutting down all the power devices in appropriate cases of thermal fault (e.g., where there is a more extreme thermal fault), even when no overcurrent or overvoltage condition is detected.

SUMMARY OF THE INVENTION

In preferred embodiments, the invention is an integrated circuit (including one or more power devices) and circuitry which reliably (and independently) shuts down each power device that is detected to be in an undesired operating condition (e.g., one or both of an overcurrent condition and an overvoltage condition) that causes a thermal fault (resulting in temperature above a threshold temperature T1), but which does not shut down any power device that is not in such an overcurrent or overvoltage condition. Typically, the integrated circuit of the invention includes multiple power devices (two or more power devices) and an overcurrent (or overvoltage) detection circuit for each power device. In typical implementations with multiple power devices and an overcurrent (or overvoltage) detection circuit for each power device, the integrated circuit preferably includes a thermal fault detection circuit and logic circuitry which receives the output of the thermal fault detection circuit and each overcurrent (overvoltage) detection circuit. The logic circuitry generates the control signals which shut down appropriate ones of the power devices in response to the detection circuit output signals it receives.

In preferred embodiments, the integrated circuit of the invention also includes fail safe thermal shutdown circuitry which shuts down all the power devices upon detecting a more severe thermal fault (resulting in temperature above a higher threshold temperature T2, where T2 is greater than T1) even when no overcurrent or overvoltage condition is detected. It is important to include such fail safe thermal shutdown circuitry to prevent damage to power devices (which would otherwise result from operation at excessively high temperature), even where the detected thermal fault is caused other than by an overcurrent or overvoltage condition of any power device on the chip (e.g., when it is caused by a fault external to the chip), or where the thermal fault is caused by a soft short (or other undesired condition) associated with a power device on the chip (where the soft short or other condition produces excessive heat but is not detectable as an overcurrent or overvoltage condition).

Another aspect of the invention is a method for implementing thermal shutdown of selected power devices of an integrated circuit. In a class of embodiments, the temperature of the circuit is monitored while the presence or absence of an overcurrent and/or overvoltage condition of each of the power devices is monitored. When a thermal fault is detected (a detected temperature exceeds a threshold temperature T1), each power device that is in an overcurrent and/or overvoltage condition is shut down (but none of the power devices that is in neither an overcurrent nor an overvoltage condition is shut down). In preferred embodiments, the method also includes the step of shutting down all the power devices upon detecting a more severe thermal fault (resulting in temperature above a higher threshold temperature T2, where T2 is greater than T1) even when no overcurrent or overvoltage condition is detected.

In other embodiments, the integrated circuit of the invention includes multiple power devices, an operating condition detection circuit for each power device, multiple thermal fault detection circuits (each positioned for measuring the local temperature at a different one of the power devices), and logic circuitry which selectively shuts down individual ones of the power devices in response to signals asserted by the thermal fault and operating condition detection circuits. Each thermal fault detection circuit asserts a control signal to the logic circuitry upon detecting that the temperature at the corresponding one of the power devices has increased to a threshold temperature. A power device is shut down only if the local temperature at such device exceeds the threshold while the device is in an undesired operating condition (e.g., one or both of an overcurrent condition and an overvoltage condition). Such embodiments provide good thermal protection while reducing or eliminating thermal crosstalk. Preferably, each thermal fault detection circuit can operate in a first mode in which it asserts a thermal fault signal to the logic circuitry upon detecting that the local temperature has increased to the threshold temperature (a relatively low temperature) or a second mode in which it asserts the thermal fault signal only upon detecting that the local temperature has increased to a higher threshold temperature. At least one (and preferably all) of the thermal fault detection circuits is configured to switch from the first mode to the second mode upon receiving a thermal fault signal from another of the thermal fault detection circuits. Thus, even if the heat spreads beyond the device in question, the other devices will have a higher thermal trip point (so as to be unaffected by thermal crosstalk). Preferably, each thermal fault detection circuit can be reset to operate in the first mode (after it has switched into the second mode of operation). Other embodiments of the invention are methods for implementing thermal shutdown of selected power devices of an integrated circuit, including the steps of independently is monitoring the local temperatures at the power devices while independently monitoring the presence or absence of an overcurrent and/or overvoltage condition of each of the power devices. When a thermal fault is detected (a detected local temperature exceeds a threshold temperature T1), the corresponding power device is shut down but only if it is in an overcurrent and/or overvoltage condition (none of the other power devices is shut down), and the threshold local temperature (for subsequent detection of a thermal fault) at some (or each) of the other power devices is increased to a temperature T2 greater than T1.

DETAILED DESCRIPTION OF THE PREFERRED EMBODIMENTS

Throughout this disclosure, including in the claims, the expression "shutting down" a device or circuit is (and variations on this expression are) used in a broad sense to include "limiting the current flow" through the device or circuit significantly as well as "terminating all current flow" through the device or circuit.

Figure 1:
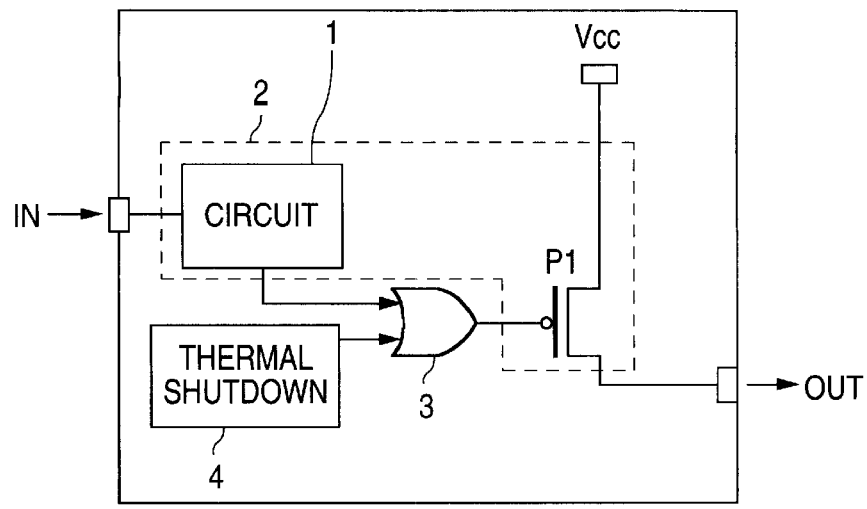
FIG. 1 is a block diagram of a conventional integrated circuit including thermal shutdown circuitry.
Figure 2:
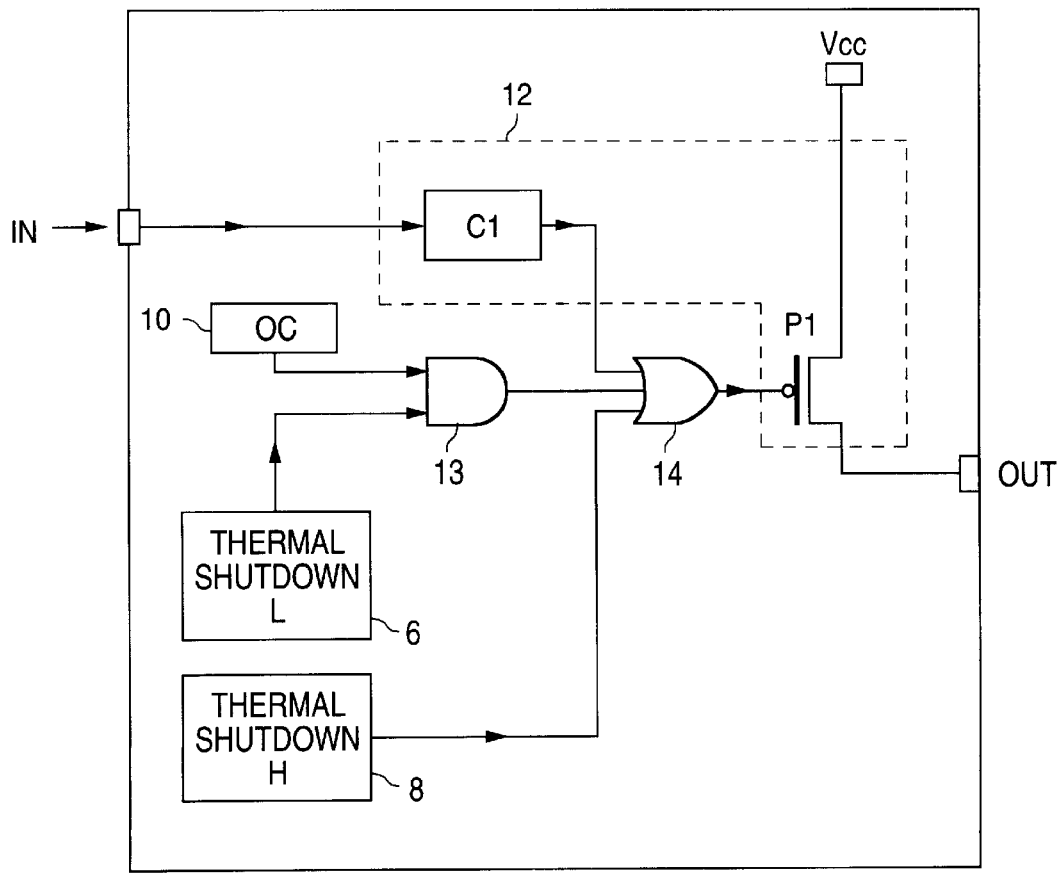
FIG. 2 is a block diagram of a first embodiment of the integrated circuit of the invention.

FIG. 2 is a block diagram of a preferred embodiment of the invention. In the integrated circuit of FIG. 2, the output of circuit 12 (produced in response to input signal IN) is coupled to output node OUT. Circuit 12 comprises P-channel MOSFET transistor P1 (connected as shown in FIG. 2), and circuitry (labeled "C1") which typically includes one or more components which are power devices (but need not include any component which is a power device). Circuitry C1 receives input signal IN and asserts in response an output signal to a first input of OR gate 14. The output of OR gate 14 is coupled to the gate of transistor P1. Thus, when each of the second and third inputs of gate 14 is at a logical "0", the level of output node OUT is determined by the level of the output signal asserted from circuitry C1 to the first input of gate 14.

The integrated circuit of FIG. 2 also includes thermal fault detection circuit 6, failsafe thermal fault detection circuit 8, operating condition detection circuit 10, and logic circuitry coupled between circuits 6, 8, and 10, and the gate of transistor P1. The logic circuitry includes AND gate 13 and the above-mentioned OR gate 14. The inputs of AND gate 13 are coupled to the outputs of circuits 6 and 10. The output of AND gate 13, the output of circuit 8, and the output of circuitry C1 are coupled to the inputs of OR gate 14. The output of OR gate 14 is coupled to the gate of transistor P1.

Consistent with the definition of "power device" set forth above, circuit 12 is a power device (which includes at least one component, transistor P1, that is also a power device). Circuit 12 may include delay circuitry, inversion circuitry, drive circuitry, or any other processing circuitry. Alternative embodiments of the invention include one or more power devices which are not PMOS transistors (or are not MOSFET transistors). For example, in variations on the FIG. 2 embodiment, PMOS transistor P1 is replaced by an NMOS transistor (with the integrated circuit embodying other changes, that will be apparent to those of ordinary skill in the art, reflecting substitution of an NMOS device for PMOS device P1) or by a bipolar transistor (with the integrated circuit embodying other changes, that will be apparent to those of ordinary skill in the art, reflecting substitution of a bipolar device for PMOS device P1), or by some other switch. It is contemplated that there are variations on each of the embodiments described herein, in which bipolar or NMOS transistors replace the PMOS transistors shown in the drawings.

Thermal fault detection circuit 6 asserts a voltage signal (a binary signal whose level is indicative of a logical "1") to AND gate 13 when the temperature at circuit 6 increases to a threshold temperature T1. Typically, T1=135 degrees (Celsius).

Operating condition detection circuit 10 asserts a voltage signal (a binary signal whose level is indicative of a logical "1") to AND gate 13 when it detects an undesired operating condition of circuit 12. In preferred embodiments, circuit 10 is configured to assert such voltage signal to AND gate 13 in response to detecting an overcurrent condition of circuit 12 (in which the current through the channel of transistor P1, or through another portion of circuit 12, exceeds a current threshold). In other preferred embodiments, circuit 10 is configured to assert the voltage signal to AND gate 13 in response to detecting an overvoltage condition of circuit 12 (in which the differential voltage across transistor P1 has reached a threshold value, or a node of circuit 12 has reached a potential above a threshold value). In other embodiments, circuit 10 is configured to assert the voltage signal to AND gate 13 only in response to detecting both an overvoltage condition and an overcurrent condition of circuit 12.

Failsafe thermal fault detection circuit 8 asserts a voltage signal (a binary signal whose level is indicative of a logical "1") to OR gate 14 when the temperature at circuit 8 increases to a higher threshold temperature T2 (where T2 is greater than T1). Typically, T2=155 degrees (Celsius).

Thus, the output of AND gate 13 is a binary voltage signal whose level is indicative of a logical "1" only when both of the following conditions occur: detection circuit 6 has detected a thermal fault on the chip (i.e., has determined that the temperature at circuit 6 has increased to the threshold temperature T1); and detection circuit 10 has detected an undesired operating condition of circuit 12 (e.g., an overvoltage or overcurrent condition). The occurrence of both of conditions indicates that the undesired operating condition of circuit 12 has very likely caused the thermal fault.

The output of OR gate 14 is a binary voltage signal which has a "high" level (a level sufficiently high to cause transistor P1 to turn off) when either of the following conditions occurs: the output of AND gate 13 is a binary voltage signal whose level is indicative of a logical "1" (indicating that a detected overvoltage or overcurrent condition, or other undesired operating condition of circuit 12 has caused a thermal fault); the output of circuit 12 is a voltage signal whose level is indicative of a logical "1"; or the output of failsafe thermal fault detection circuit 8 is a binary voltage signal whose level is indicative of a logical "1" (indicating a more severe thermal fault on the chip, in which the chip temperature has risen to the higher threshold temperature T2). As a result, transistor P1 (and thus circuit 12) shuts down under any of the noted conditions.

Thermal fault detection circuit 6 is labeled "Thermal shutdown L" to indicate the relatively low threshold temperature T1 associated therewith, and thermal fault detection circuit 8 is labeled "Thermal shutdown H" to indicate the relatively high threshold temperature T2 associated therewith.

Figure 3:
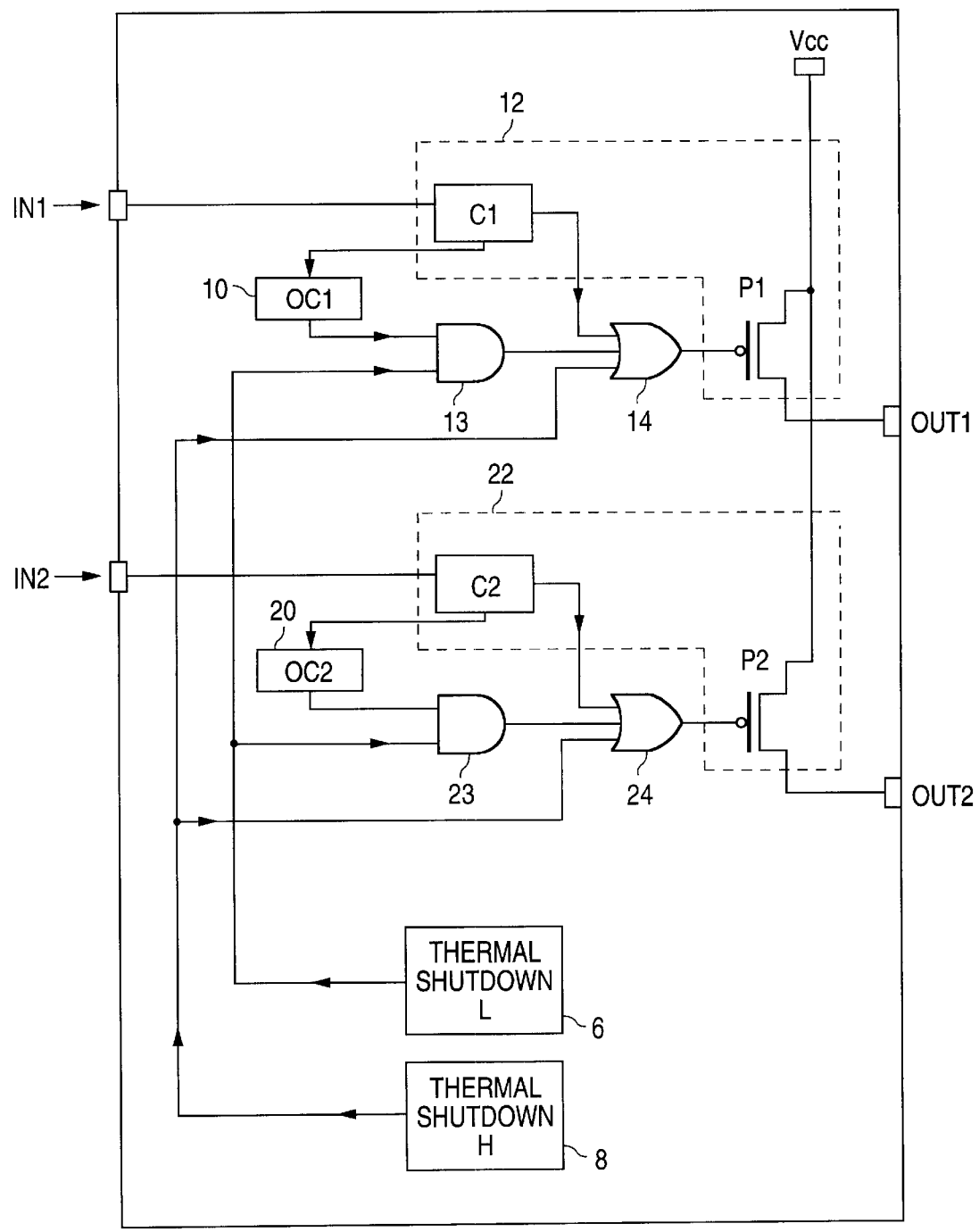
FIG. 3 is a block diagram of a second embodiment of the integrated circuit of the invention.

FIG. 3 is a block diagram of another preferred embodiment of the integrated circuit of the invention. In the integrated circuit of FIG. 3, the output of circuit 12 (produced in response to input signal IN1) is coupled to output node OUT1, and the output of circuit 22 (produced in response to input signal IN2) is coupled to output node OUT2. Circuit 12 comprises P-channel MOSFET transistor P1 (connected as shown), and circuitry (labeled "C1") which typically includes one or more components which are power devices (but need not include any component which is a power device). Circuitry C1 receives input signal IN1 and asserts in response an output signal to a first input of OR gate 14. The output of OR gate 14 is coupled to the gate of transistor P1. Thus, when each of the second and third inputs of gate 14 is at a logical "0", the level of output node OUT1 is determined by the level of the output signal asserted from circuitry C1 to the first input of gate 14. Circuit 22 comprises P-channel MOSFET transistor P2 (connected as shown), and circuitry (labeled "C2") which typically includes one or more components which are power devices (but need not include any component which is a power device). Circuitry C2 receives input signal IN2 and asserts in response an output signal to a first input of OR gate 24. The output of OR gate 24 is coupled to the gate of transistor P2. Thus, when each of the second and third inputs of gate 24 is at a logical "0", the level of output node OUT2 is determined by the level of the output signal asserted from circuitry C2 to the first input of gate 24.

Consistent with the definition of "power device" set forth above, circuit 12 is a power device (which includes at least one component, transistor P1, that is also a power device) and circuit 22 is a power device (which includes at least one component, transistor P2, that is also a power device).

The integrated circuit of FIG. 3 also includes thermal fault detection circuit 6, failsafe thermal fault detection circuit 8, operating condition detection circuits 10 and 20, and logic circuitry coupled between circuits 6, 8, 10, and 20 and the gates of transistors P1 and P2. The logic circuitry includes AND gate 13, OR gate 14, AND gate 23, and OR gate 24. The inputs of AND gate 13 are coupled to the outputs of circuits 6 and 10. The output of circuit 21 is coupled to a first input of OR gate 14, the output of AND gate 13 is coupled to a second input of OR gate 14, and the output of circuit 8 is coupled to a third input of OR gate 14. The output of OR gate 14 is coupled to the gate of transistor P1. The inputs of AND gate 23 are coupled to the outputs of circuits 6 and 20. The output of circuit 22 is coupled to a first input of OR gate 24, the output of AND gate 23 is coupled to a second input of OR gate 24, and the output of circuit 8 is coupled to the third input of OR gate 24. The output of OR gate 24 is coupled to the gate of transistor P2.

Thermal fault detection circuit 6 asserts a voltage signal (a binary signal whose level is indicative of a logical "1") to AND gates 13 and 23 when the temperature at circuit 6 increases to a threshold temperature T1. Typically, T1=135 degrees (Celsius).

Operating condition detection circuit 10 asserts a voltage signal (a binary signal whose level is indicative of a logical "1") to AND gate 13 when it detects an undesired operating condition of circuit 12. In preferred embodiments, circuit 10 is configured to assert such voltage signal to AND gate 13 in response to detecting an overcurrent condition of circuit 12 (in which the current through the channel of transistor P1, or another portion of circuit 12, exceeds a current threshold). In other preferred embodiments, circuit 10 is configured to assert the voltage signal to AND gate 13 in response to detecting an overvoltage condition of circuit 12 (in which the differential voltage across transistor P1 has reached a threshold value, or a node of circuit 12 has reached a potential above a threshold value). In other embodiments, circuit 10 is configured to assert the voltage signal to AND gate 13 only in response to detecting both of (or at least one of) an overvoltage condition and an overcurrent condition of circuit 12.

Operating condition detection circuit 20 asserts a voltage signal (a binary signal whose level is indicative of a logical "1") to AND gate 23 when it detects an undesired operating condition of circuit 22. In preferred embodiments, circuit 20 is configured to assert such voltage signal to AND gate 23 in response to detecting an overcurrent condition of circuit 22 (in which the current through the channel of transistor P2 exceeds a current threshold, or through another power device of circuit 22). In other preferred embodiments, circuit 20 is configured to assert the voltage signal to AND gate 23 in response to detecting an overvoltage condition of circuit 22 (in which the differential voltage across transistor P2 has reached a threshold value, or a node of circuit 22 has reached a potential above a threshold value). In other embodiments, circuit 20 is configured to assert the voltage signal to AND gate 23 only in response to detecting both of (or at least one of) an overvoltage condition and an overcurrent condition of circuit 22.

Failsafe thermal fault detection circuit 8 asserts a voltage signal (a binary signal whose level is indicative of a logical "1") to OR gates 14 and 24 when the temperature at circuit 8 increases to a higher threshold temperature T2 (where T2 is greater than T1). Typically, T2=155 degrees (Celsius).

Thus:

1. the output of AND gate 13 is a binary voltage signal whose level is indicative of a logical "1" only when both of the following conditions occur: detection circuit 6 has detected a thermal fault on the chip (i.e., has determined that the temperature at circuit 6 has increased to the threshold temperature T1); and detection circuit 10 has detected an undesired operating condition of circuit 12 (e.g., an overvoltage or overcurrent condition). The occurrence of both of conditions indicates that the undesired operating condition of circuit 12 has very likely caused the thermal fault (i.e., entirely caused the thermal fault or contributed to its cause); and 2. the output of AND gate 23 is a binary voltage signal whose level is indicative of a logical "1" only when both of the following conditions occur: detection circuit 6 has detected a thermal fault on the chip, and detection circuit 20 has detected an undesired operating condition of circuit 22 (e.g., an overvoltage or overcurrent condition). The occurrence of both of conditions indicates that the undesired operating condition of circuit 22 has very likely caused the thermal fault (i.e., entirely caused the thermal fault or contributed to its cause).

The output of OR gate 14 is a binary voltage signal which has a "high" level (a level sufficiently high to cause transistor P1 to turn off) when either of the following conditions occurs: the output of AND gate 13 is a binary voltage signal whose level is indicative of a logical "1" (indicating that a detected overvoltage, overcurrent, or other undesired operating condition of circuit 12 has caused a thermal fault); or the output of failsafe thermal fault detection circuit 8 is a binary voltage signal whose level is indicative of a logical "1" (indicating a more severe thermal fault on the chip, in which the chip temperature has risen to the higher threshold temperature T2). As a result, transistor P1 (and thus circuit 12) shuts down under either of the noted conditions.

The output of OR gate 24 is a binary voltage signal which has a "high" level (a level sufficiently high to cause transistor P2 to turn off) when either of the following conditions occurs: the output of AND gate 23 is a binary voltage signal whose level is indicative of a logical "1" (indicating that a detected overvoltage, overcurrent, or other undesired operating condition of circuit 22 has caused a thermal fault); or the output of failsafe thermal fault detection circuit 8 is a binary voltage signal whose level is indicative of a logical "1" (indicating a more severe thermal fault on the chip, in which the chip temperature has risen to the higher threshold temperature T2). As a result, transistor P2 (and thus circuit 22) shuts down under either of the noted conditions.

Thus, the integrated circuit of FIG. 3 reliably (and independently) shuts down each of circuit 12 (including power device P1) and circuit 22 (including power device P2) that is detected to be in an undesired operating condition that has caused a thermal fault (i.e., an undesired operating condition that has entirely caused the thermal fault or contributed to causing it) in which the chip temperature has risen above threshold temperature T1. However, the FIG. 3 circuit does not shut down any power device (e.g., device P1 or P2) that is not in such an undesired operating (e.g., overcurrent or overvoltage) condition. The integrated circuit of FIG. 3 also includes fail safe thermal shutdown circuitry which shuts down both power devices P1 and P2 (and the circuits 12 and 22) upon detecting a more severe thermal fault (in which the chip temperature has risen above a higher threshold temperature T2, where T2 is greater than T1) even when no undesired operating condition of any of the power devices has been detected. The fail safe thermal shutdown circuitry prevents damage to power devices of the FIG. 3 circuit (e.g., P1 and P2) which would otherwise occur as a result of operation at excessively high temperature, even where the thermal fault detected by circuit 8 is caused other than by an undesired operating condition of any power device on the chip (e.g., when it is caused by a fault external to the chip), or where the thermal fault is caused by a soft short (or other undesired condition) associated with circuit 12 or 22 or a power device of circuit 12 or 22 (where the soft short or other condition produces excessive heat but is not detectable as an undesired condition by circuits 10 and 20).

Figure 4:
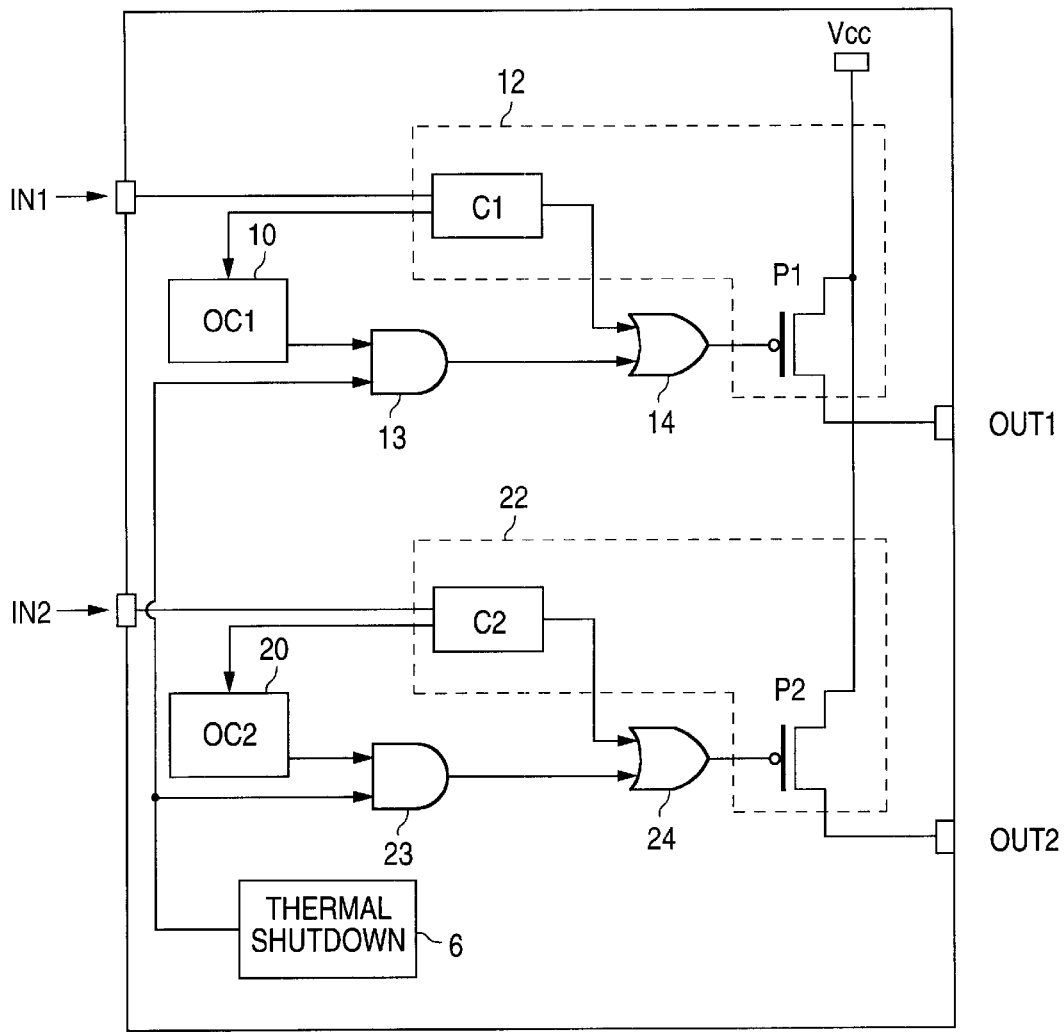
FIG. 4 is a block diagram of a third embodiment of the intagrated circuit of the invention.

FIG. 4 is a block diagram of another preferred embodiment of the integrated circuit of the invention. The integrated circuit of FIG. 4 is identical to that of FIG. 3, except in that it lacks failsafe thermal fault detection circuit 8 and OR gates 14 and 24, in that the output of AND gate 13 is coupled directly to the gate of P1, and in that the output of AND gate 23 is coupled directly to the gate of P2. The description of those elements of FIG. 4 which are identical to elements of FIG. 3 will not be repeated with reference to FIG. 4.

In operation of the integrated circuit of FIG. 4, thermal fault detection circuit 6 asserts a voltage signal (a binary signal whose level is indicative of a logical "1") to AND gates 13 and 23 when the temperature at circuit 6 increases to a threshold temperature T.

Operating condition detection circuit 10 asserts a voltage signal (a binary signal whose level is indicative of a logical "1") to AND gate 13 when it detects an undesired operating condition of circuit 12. In preferred embodiments, circuit 10 is configured to assert such voltage signal to AND gate 13 in response to detecting an overcurrent condition of circuit 12 (in which the current through the channel of transistor P1, or another portion of circuit 12, exceeds a current threshold).

Operating condition detection circuit 20 asserts a voltage signal (a binary signal whose level is indicative of a logical "1") to AND gate 23 when it detects an undesired operating condition of circuit 22. In preferred embodiments, circuit 20 is configured to assert such voltage signal to AND gate 23 in response to detecting an overcurrent condition of circuit 22 (in which the current through the channel of transistor P2, or through another portion of circuit 20, exceeds a threshold current).

The output of AND gate 13 is a binary voltage signal whose level is indicative of a logical "1" (a level sufficiently high to cause transistor P1 to turn off) only when both of the following conditions occur: detection circuit 6 has detected a thermal fault on the chip (i.e., has determined that the temperature at circuit 6 has increased to the threshold temperature T); and detection circuit 10 has detected an undesired operating condition of circuit 12 (e.g., an overvoltage or overcurrent condition). The occurrence of both of conditions indicates that the undesired operating condition of circuit 12 has very likely caused the thermal fault (i.e., entirely caused the thermal fault or contributed to its cause).

The output of AND gate 23 is a binary voltage signal whose level is indicative of a logical "1" (a level sufficiently high to cause transistor P2 to turn off) only when both of the following conditions occur: detection circuit 6 has detected a thermal fault on the chip, and detection circuit 20 has detected an undesired operating condition of circuit 22 (e.g., an overvoltage or overcurrent condition). The occurrence of both of conditions indicates that the undesired operating condition of circuit 22 has very likely caused the thermal fault (i.e., entirely caused the thermal fault or contributed to its cause).

Figure 5:
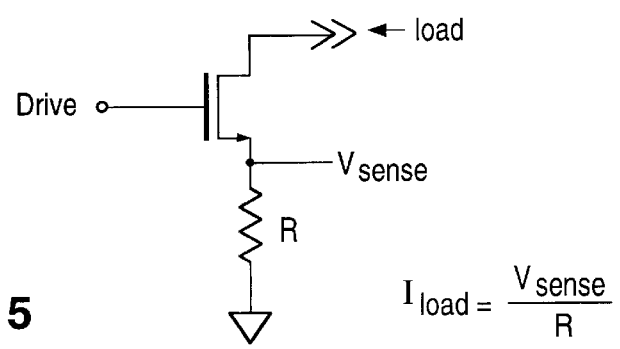
FIG. 5 is a schematic diagram of one implementation of operating condition detection circuit 10 (or 20) of the embodiment of FIG. 2, 3, or 4.
Figure 6:
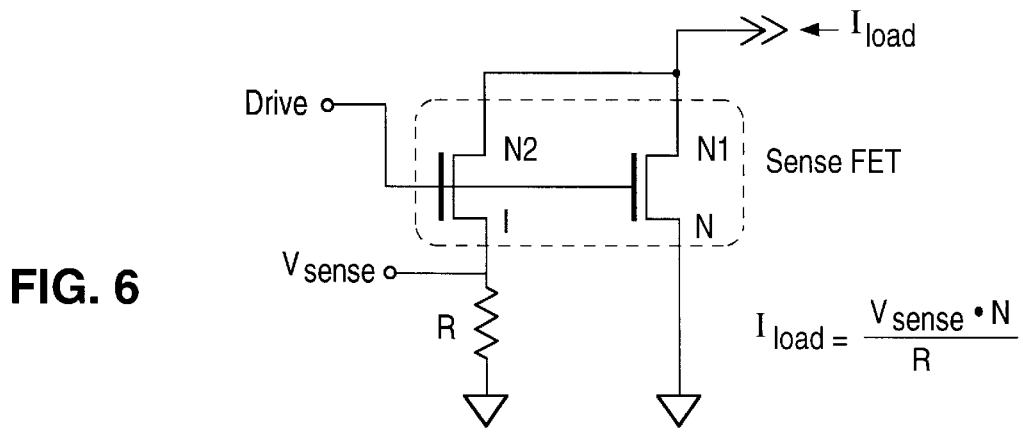
FIG. 6 is a schematic diagram of another implementation of detection circuit 10 (or 20) of the embodiment of FIG. 2, 3, or 4.
Figure 7:
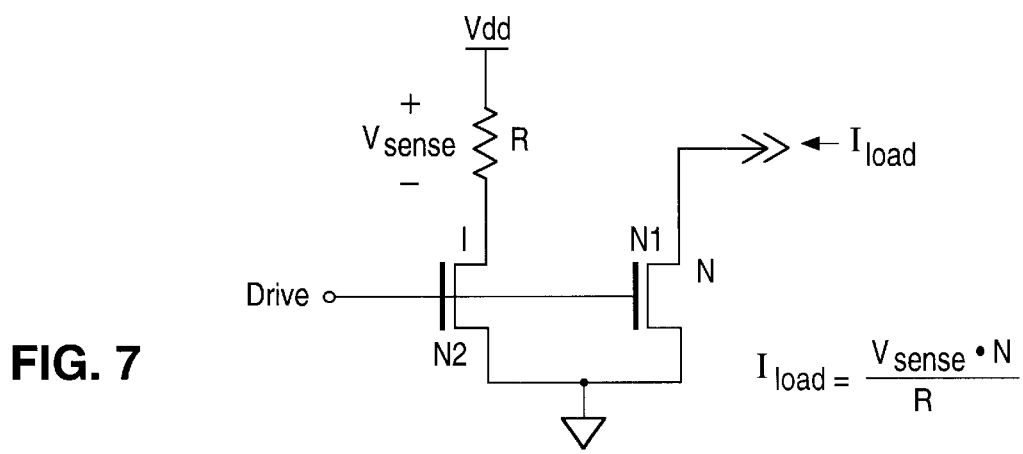
FIG. 7 is a schematic diagram of another implementation of detection circuit 10 (or 20) of the embodiment of FIG. 2, 3, or 4.

Each of FIGS. 5, 6, and 7 is an implementation of operating condition detection circuit 10 (or 20) for use in any of the described embodiments of the invention. Each such implementation produces an output indicative of an overcurrent condition.

In the FIG. 5 implementation, the operating condition detection circuit comprises an N-channel MOSFET ("NMOS") transistor having a drain coupled to the circuitry whose current being monitored (e.g., circuit 12 of FIG. 2), a source coupled to ground through a resistor R, and a biased gate biased (biased by the signal labeled "Drive"). The potential $V_{sense}$ at the NMOS transistor's source is $V_{sense}=I_{load}$ (R), where $I_{load}$ is the current drawn from the circuitry being monitored. An increase of potential $V_{sense}$ beyond a threshold level is indicative of an overcurrent condition.

In the FIG. 6 implementation, the operating condition detection circuit comprises NMOS transistors N1 and N2 and resistor R. The common drains of N1 and N2 are coupled to the circuitry whose current being monitored, the source of N1 is grounded, the source of N2 is coupled to ground through resistor R, and the gates of N1 and N2 are biased by the signal labeled "Drive". Since the size ratio of transistors N1 and N2 is "N" (as indicated), the potential $V_{sense}$ at the source of transistor N2 is $V_{sense}=I_{load}(R/N)2$ where $I_{load}$ is the current drawn from the circuitry being monitored. An increase of potential $V_{sense}$ beyond a threshold level is indicative of an overcurrent condition.

In the FIG. 7 implementation, the operating condition detection circuit comprises NMOS transistors N1 and N2 and resistor R. The drain of N1 is coupled to the circuitry whose current being monitored, the drain of N2 is coupled through resistor R to a node at supply potential $V_{dd}$, the common sources of N1 and N2 are grounded, and the gates of N1 and N2 are biased by the signal labeled "Drive". Since the size ratio of transistors N1 and N2 is "N" (as indicated), the voltage $V_{sense}$ across resistor R is $V_{sense}=I_{load}(R/N)$, where $I_{load}$ is the current drawn from the circuitry being monitored. An increase of potential $V_{sense}$ beyond a threshold level is indicative of an overcurrent condition.

In other implementations of the invention, techniques other than the current sensing techniques embodied in the circuits of FIGS. 5–7 are used to implement overcurrent detection, with the technique employed in each case depending on the application. For example, it is appropriate to use Hall effect or magnetic sensors in some applications.

Figure 8:
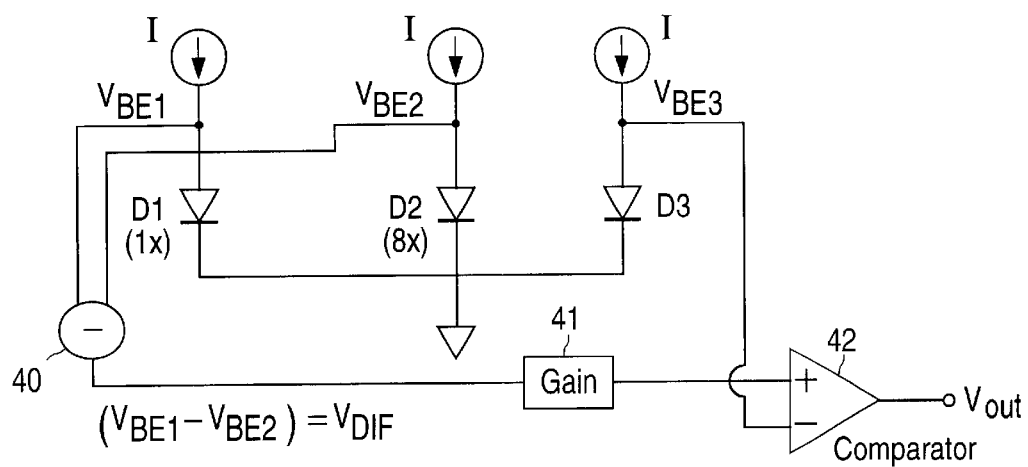
FIG. 8 is a schematic diagram of an implementation of thermal fault detection circuit 6 (or 8) of the embodiment of FIG. 2, 3, or 4.

Each thermal fault detection circuit of the invention can be implemented in any of several well known ways. FIG. 8 is a schematic diagram of one implementation of thermal fault detection circuit 6 (or 8) of the embodiment of FIG. 2, 3, or 4. In the FIG. 8 implementation, potential $V_{DIF}$ increases (proportionally) with increasing temperature of the FIG. 8 circuit, potential $V_{BE3}$ decreases with increasing temperature of the FIG. 8 circuit, and comparison of these two potentials generates a signal indicative of the absolute temperature of the FIG. 8 circuit.

In FIG. 8, each of diodes D1, D2, and D3 is connected between a current source and ground. Each diode is typically implemented using a bipolar transistor, with the voltage ($V_{BE1}$ in diode D1, $V_{BE2}$ in diode D2, or $V_{BE3}$ in diode D3) between the base and emitter of the bipolar transistor allowed to drift in response to variations in temperature at the diodes. Each of $V_{BE1}$, $V_{BE2}$, and $V_{BE3}$ decreases in response to increasing temperature (each typically being about 700 mV above ground at room temperature, and decreasing by about 2 mV per degree Celsius). Diode D2 is eight times larger than diode D1 (e.g., by comprising eight bipolar transistors, each of the same size as the bipolar transistor of diode D1).

One input of circuit 40 (at potential $V_{BE1}$ above ground) is coupled to diode D1, the other input of circuit 40 (at potential $V_{BE2}$ above ground) is coupled to diode D2, and the output ($V_{DIF}$) of circuit 40 is at potential $V_{DIF}=V_{BE1}-V_{BE2}$ above ground. Due to the size difference between D2 and D1, $V_{DIF}$ increases (proportionally) with increasing temperature of the FIG. 8 circuit.

The output signal $V_{DIF}$ is amplified by circuit 41 and asserted to one input of comparator 42 (the gain of circuit 41 is set to a level as required to detect temperature in the desired range). The other input of comparator 42 is coupled to diode D3 as shown, and is at potential $V_{BE3}$ above ground. The FIG. 8 circuit is implemented so that the trip point of comparator 42 corresponds to the relevant threshold temperature (which is deemed to indicate a thermal fault). The output of comparator 42 ($V_{OUT}$) is a binary voltage signal having a logical "1" value above the trip point, and a logical "0" value below the trip point.

Another aspect of the invention is a method for selectively shutting down a power device of an integrated circuit, where the integrated circuit comprises multiple power devices, the method including the steps of:

(a) monitoring the temperature of the integrated circuit to detect occurrence of a thermal fault in which said temperature exceeds a threshold temperature T1;

(b) monitoring an operating condition of the power device to detect occurrence of an undesired operating condition of the power device; and (c) in response to detection of both the thermal fault and the undesired operating condition of the power device, shutting down the power device.

Preferably, the undesired operating condition is an overcurrent condition, an overvoltage condition, or an overcurrent condition with an overvoltage condition. In some preferred embodiments, the method also includes the steps of:

monitoring the temperature of the integrated circuit to detect occurrence of a more severe thermal fault in which said temperature exceeds a second threshold temperature T2, where T2 is greater than T1; and shutting down two or more of the power devices of the integrated circuit upon detecting the more severe thermal fault, even if there has been no detection of the undesired operating condition of the power device.

Also preferably, the integrated circuit comprises a second power device (in addition to the power device mentioned in steps (b) and (c)) and the method includes the steps of:

monitoring an operating condition of the second power device to detect occurrence of an undesired operating condition of the second power device; and in response to detection of both the thermal fault and the undesired operating condition of the second power device, shutting down the second power device.

Another aspect of the invention is a method for shutting down a power device of an integrated circuit, which includes the steps of:

(a) monitoring the temperature of the integrated circuit to detect occurrence of a thermal fault in which said temperature exceeds a threshold temperature T1;

(b) monitoring an operating condition of the power device to detect occurrence of an undesired operating condition of the power device;

(c) in response to detection of both the thermal fault and the undesired operating condition of the power device, shutting down the power device;

(d) monitoring the temperature of the integrated circuit to detect occurrence of a more severe thermal fault in which said temperature exceeds a second threshold temperature T2, where T2 is greater than T1; and (e) shutting down the power device upon detecting the more severe thermal fault, even if there has been no detection of the undesired operating condition of said power device.

Figure 9:
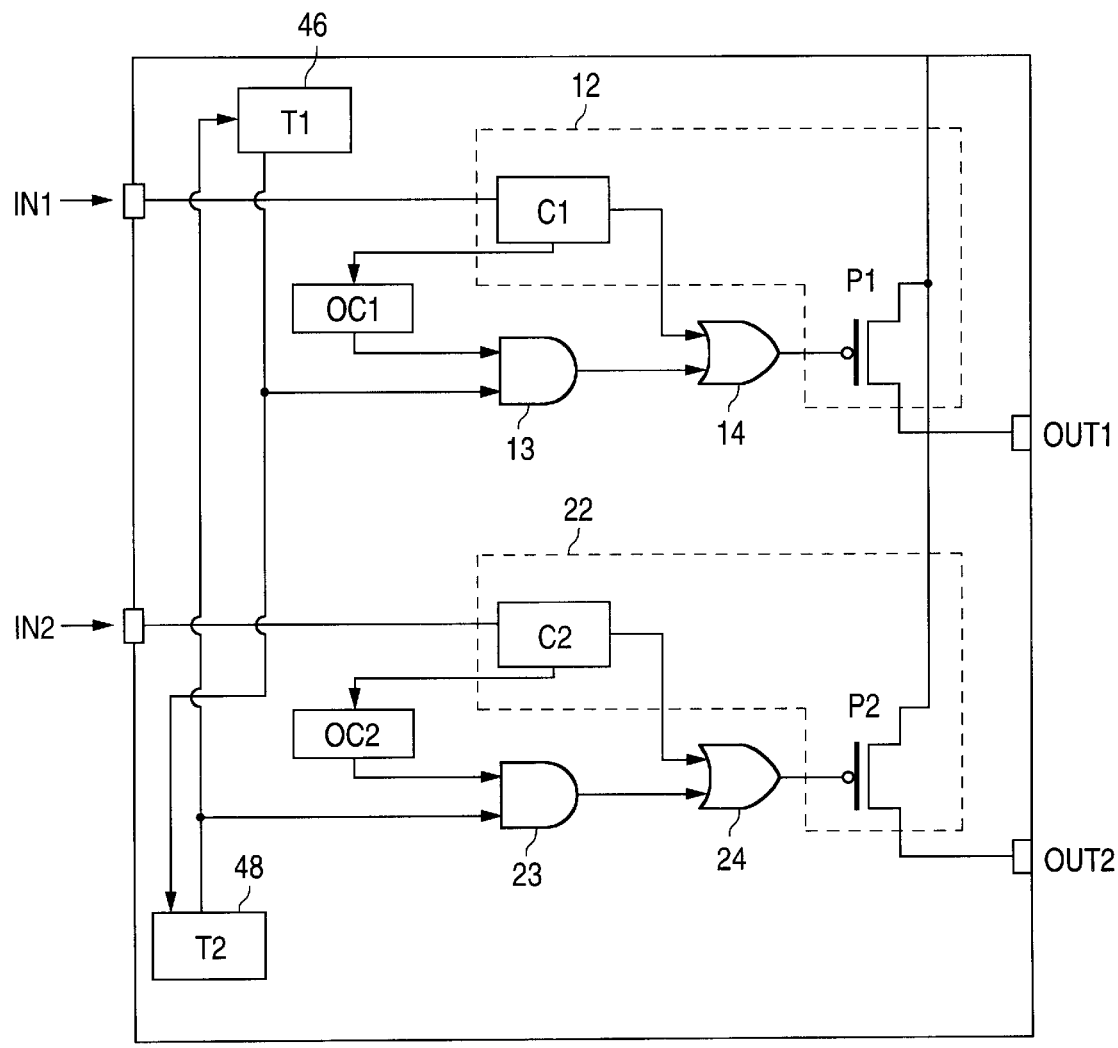
FIG. 9 is a schematic diagram of another embodiment of the invention.

The integrated circuit of FIG. 9 is an example of another class of embodiments of the invention. The integrated circuit of FIG. 9 is a variation on the FIG. 3 circuit, in which circuit elements of FIG. 9 which are identical to corresponding elements of FIG. 3 are identically numbered in both Figures. The FIG. 9 circuit includes thermal fault detection circuits 46 and 48, with detection circuit 46 having been formed in a position that is nearer to power device 12 than to power device 22, and detection circuit 48 having been formed in a position nearer to power device 22 than to power device 12. Thermal fault detection circuit 46 is initialized to operate in a first operating mode in which it asserts a control signal (a thermal fault signal) to AND gate 13 and thermal fault detection circuit 48 upon detecting that the local temperature of the integrated circuit (the temperature at circuit 46) has increased to a threshold temperature T1. Thermal fault detection circuit 48 is initialized to operate in a first operating mode in which it asserts a control signal (a thermal fault signal) to AND gate 23 and thermal fault detection circuit 46 upon detecting that the local temperature of the integrated circuit (the temperature at circuit 48) has increased to a threshold temperature T2 (in typical implementations, T2=T1). Thermal fault detection circuit 46 is configured to switch from the first mode to a second operating mode upon receiving a thermal fault signal from detection circuit 48, and thermal fault detection circuit 48 is configured to switch from the first mode to a second operating mode upon receiving a thermal fault signal from detection circuit 46. In the second mode, detection circuit 46 asserts a control signal (a thermal fault signal) to AND gate 13 and thermal fault detection circuit 48 only upon detecting that the local temperature of the integrated circuit (the temperature at circuit 46) has increased to a threshold temperature T3 (where T3 is greater than T1). In the second mode, detection circuit 48 asserts a control signal (a thermal fault signal) to AND gate 23 and thermal fault detection circuit 46 only upon detecting that the local temperature of the integrated circuit (the temperature at circuit 48) has increased to a threshold temperature T4 (where T4 is greater than T2). In typical implementations, T4=T2. Thus, in the event of a thermal fault of device 12, even if some of the excess heat spreads beyond device 12 to device 22, device 22 will have a higher thermal trip point (T4) so as to be unaffected by thermal crosstalk. Similarly, in the event of a thermal fault of device 22, even if some of the excess heat spreads beyond device 22 to device 12, device 12 will have a higher thermal trip point (T3) so as to be unaffected by thermal crosstalk.

Preferably, each of thermal fault detection circuits 46 and 48 is resettable to resume operation in its first mode after it has switched into its second mode of operation.

Other embodiments of the invention are methods for implementing selective thermal shutdown of power devices of an integrated circuit (e.g., that of FIG. 9) which includes multiple power devices, including at least a first power device and a second power device. One such method includes the steps of:

(a) independently monitoring local temperature at each of the first power device and the second power device;

(b) while performing step (a), independently monitoring the presence or absence of an undesired operating condition (e.g., an overcurrent and/or overvoltage condition) of each of the first power device and the second power device;

(c) upon detecting that the local temperature at the first power device exceeds a threshold temperature T1, shutting down said first power device, but only if it is in an undesired operating condition and without shutting down the second power device.

Preferably, step (c) also includes the step of: increasing the threshold local temperature for subsequent detection of a thermal fault at the second power device to a temperature T2, where T2 is greater than T1. This is preferably done by causing step (a) to include the steps of independently monitoring the local temperature at each of the first power device and the second power device to determine whether each said local temperature exceeds the threshold temperature T1, and including in the method the steps of:

(d) after step (c), monitoring the local temperature at the second power device to determine whether said local temperature at the second power device exceeds a higher threshold temperature T2, where T2 is greater than T1; and (e) after step (d), shutting down the second power device upon detecting that the local temperature at said second power device exceeds the higher threshold temperature T2, but only if the second power device is in an undesired operating condition.

Another such method includes the steps of:

(a) independently monitoring the temperature at a first location nearer to the first power device than to the second power device and at a second location nearer to a second power device than to the first power device;

(b) while performing step (a), independently monitoring the presence or absence of an undesired operating condition (e.g., an overcurrent and/or overvoltage condition) of each of the first power device and the second power device; and (c) upon detecting that the temperature at the first location exceeds a threshold temperature T1, shutting down the first power device, but only if said first power device is then in an undesired operating condition and without shutting down the second power device.

Preferably, step (a) includes the steps of independently monitoring the temperature at the first location and the temperature at the second location to determine whether each said temperature exceeds the threshold temperature T1, and the method also includes the step of:

(d) after step (c), monitoring the temperature at the second location to determine whether said temperature at the second location exceeds a higher threshold temperature T2, where T2 is greater than T1.

It should be understood that various other alternatives to the embodiments of the invention described herein may be employed in practicing the invention. For example, the operating condition detection circuit of the invention (e.g., circuit 10) can contain a latch, and the thermal fault detection circuit and failsafe thermal fault detection circuit of the invention can be implemented as two separate circuits (e.g., circuits 6 and 8 of FIG. 2) or as a single circuit with two outputs (e.g., one circuit performing the functions of both circuits 6 and 8 of FIG. 2). It is intended that the following claims define the scope of the invention and that structures and methods within the scope of these claims and their equivalents be covered thereby.

What is claimed is:

1. An integrated circuit whose temperature is subject to variation with time during operation, including:

at least two power devices;

a thermal fault detection circuit positioned at a first location nearer to a first one of the power devices than to each other one of the power devices and configured to assert a first signal upon detecting that the temperature of the integrated circuit at the first location has increased to a threshold temperature;

a second thermal fault detection circuit positioned at a second location nearer to a second one of the power devices than to each other one of the power devices and configured to assert a second signal upon detecting that the temperature of the integrated circuit at the second location has increased to a second threshold temperature;

operating condition detection circuitry coupled to the power devices and configured to assert a third signal upon detecting an undesired operating condition of the first one of the power devices and to assert a fourth signal upon detecting an undesired operating condition of the second one of the power devices; and logic circuitry, coupled to the thermal fault detection circuit, the second thermal fault detection circuit, the operating condition detection circuitry, the first one of the power devices, and the second one of the power devices, and configured to shut down the first one of the power devices in response to concurrent assertion of the first signal and the third signal, and to shut down the second one of the power devices in response to concurrent assertion of the second signal and the fourth signal, but not to shut down the second one of the power devices in response to concurrent assertion of the first signal and the fourth signal.

2. The integrated circuit of claim 1, wherein the logic circuitry includes:

a first AND gate having inputs coupled to receive the first signal and the third signal and also having an output;

a first OR gate having a first input coupled to the output of the first AND gate, an output coupled to the first one of the power devices for asserting a control signal to said first one of the power devices, and a second input;

a second AND gate having inputs coupled to receive the second signal and the fourth signal and also having an output; and a second OR gate having a first input coupled to the output of the second AND gate, an output coupled to the second one of the power devices for asserting a second control signal to said second one of the power devices, and a second input.

3. The integrated circuit of claim 1, wherein the thermal fault detection circuit is configured to operate in one of a first mode in which it asserts the first signal upon detecting that the temperature of the integrated circuit at the first location has increased to the threshold temperature, and a second mode in which it asserts the first signal only upon detecting that the temperature of the integrated circuit at the first location has increased to a third threshold temperature greater than the threshold temperature, the thermal fault detection circuit is configured to switch from the first mode to the second mode in response to the second signal, and the thermal fault detection circuit is coupled to receive said second signal from the second thermal fault detection circuit.

4. The integrated circuit of claim 3, wherein the second thermal fault detection circuit is configured to operate in one of a first mode in which it asserts the second signal upon detecting that the temperature of the integrated circuit at the second location has increased to the second threshold temperature, and a second mode in which it asserts the second signal only upon detecting that the temperature of the integrated circuit at the second location has increased to a fourth threshold temperature greater than the second threshold temperature, the second thermal fault detection circuit is configured to switch from the first mode to the second mode in response to the first signal, and the second thermal fault detection circuit is coupled to receive said first signal from the thermal fault detection circuit.

5. The integrated circuit of claim 4, wherein the threshold temperature is at least substantially equal to the second threshold temperature, and the third threshold temperature is at least substantially equal to the fourth threshold temperature.

6. The integrated circuit of claim 1, wherein the threshold temperature is at least substantially equal to the second threshold temperature.

7. An integrated circuit whose temperature is subject to variation with time during operation, including:
   a power device;
   a thermal fault detection circuit configured to assert a first signal upon detecting that the temperature of the integrated circuit has increased to a threshold temperature;
   an operating condition detection circuit coupled to the power device and configured to monitor an operating condition of the power device and assert a second signal upon detecting an undesired operating condition of the power device;
   logic circuitry coupled to the power device and coupled to receive the first signal and the second signal, and configured to assert a control signal to the power device in response to concurrent assertion of the first signal and the second signal by the thermal fault detection circuit and the operating condition detection circuit, wherein the power device is configured to shut down in response to the control signal, wherein the logic circuitry includes a first AND gate having inputs coupled to receive the first signal and the second signal and also having an output, and a first OR gate having an input coupled to the output of the first AND gate, a second input, and an output coupled to the power device for asserting said control signal to the power device; and
   a failsafe thermal fault detection circuit coupled and configured to assert a third signal to the second input of the first OR gate upon detecting that the temperature of the integrated circuit has increased to a second threshold temperature, wherein the second threshold temperature is greater than the threshold temperature, whereby the first OR gate asserts the control signal to the power device in response to assertion of the third signal by the failsafe thermal fault detection circuit even when there is no concurrent assertion of the first signal and the second signal by the thermal fault detection circuit and the operating condition detection circuit.

8. The integrated circuit of claim 7, wherein the threshold temperature is at least substantially equal to 135 degrees.

9. The integrated circuit of claim 7, wherein the second threshold temperature is at least substantially equal to 155 degrees.

10. The integrated circuit of claim 7, also including:
    at least one other power device in addition to said power device, so that said integrated circuit comprises multiple power devices; and
    a failsafe thermal fault detection circuit coupled and configured to assert a third signal to the logic circuitry upon detecting that the temperature of the integrated circuit has increased to a second threshold temperature, wherein the second threshold temperature is greater than the threshold temperature, and wherein the logic circuitry is coupled and configured to assert control signals to all the power devices in response to assertion of the third signal by the failsafe thermal fault detection circuit even when there is no concurrent assertion of the first signal and the second signal by the thermal fault detection circuit and the operating condition detection circuit.

11. The integrated circuit of claim 7, wherein the undesired operating condition is an overcurrent condition.

12. The integrated circuit of claim 7, wherein the undesired operating condition is an overvoltage condition.

13. The integrated circuit of claim 7, also including:
    a second power device; and
    a second operating condition detection circuit coupled to the second power device and configured to monitor an operating condition of the second power device and assert a third signal upon detecting an undesired operating condition of the second power device, and wherein
    the logic circuitry is coupled to the second power device as well as to the power device, is coupled to receive the third signal as well as the first signal and the second signal, and is configured to assert a second control signal to the second power device in response to concurrent assertion of the first signal and the third signal by the thermal fault detection circuit and the second operating condition detection circuit, wherein the second power device is configured to shut down in response to the second control signal, and the logic circuitry includes a second AND gate having inputs coupled to receive the first signal and the fauld signal and also having an output, and a second OR gate having an input coupled to the output of the second AND gate and also having an output coupled to the second power device for asserting said second control signal to the second power device.

14. An integrated circuit whose temperature is subject to variation with time during operation, including:
    at least two power devices;
    a thermal fault detection circuit configured to assert a first signal upon detecting that the temperature of the integrated circuit has increased to a threshold temperature;
    operating condition detection circuitry coupled to the power devices and configured to assert a second signal upon detecting an undesired operating condition of a first one of the power devices and to assert a third signal upon detecting an undesired operating condition of a second one of the power devices;
    logic circuitry, coupled to the thermal fault detection circuit, the operating condition detection circuitry, the first one of the power devices, and the second one of the power devices, and configured to shut down the first one of the power devices in response to concurrent assertion of the first signal and the second signal, and to shut down the second one of the power devices in response to concurrent assertion of the first signal and the third signal, but not to shut down the second one of the power devices in response to concurrent assertion of the first signal and the third signal; and
    a failsafe thermal fault detection circuit coupled to the logic circuit and configured to assert a fourth signal upon detecting that the temperature of the integrated circuit has increased to a second threshold temperature greater than the threshold temperature, wherein the logic circuitry includes:
    a first AND gate having inputs coupled to receive the first signal and the second signal and also having an output;
    a first OR gate having a first input coupled to the output of the first AND gate, a second input coupled to the failsafe thermal fault detection circuit, and an output coupled to the first one of the power devices for asserting a control signal to said first one of the power devices;
    a second AND gate having inputs coupled to receive the first signal and the third signal and also having an output; and a second OR gate having a first input coupled to the output of the second AND gate, a second input coupled to the failsafe thermal fault detection circuit, and an output coupled to the second one of the power devices for asserting a second control signal to said second one of the power devices, wherein the failsafe thermal fault detection circuit is coupled and configured to assert the fourth signal to the second input of the first OR gate and to the second input of the second OR gate upon detecting that the temperature of the integrated circuit has increased to the second threshold temperature, whereby the first OR gate and the second OR gate respectively assert the control signal to the first one of the power devices and the second control signal to the second one of the power devices in response to assertion of the fourth signal by the failsafe thermal fault detection circuit.

15. The integrated circuit of claim 14, wherein each said undesired operating condition is an overcurrent condition.

16. The integrated circuit of claim 14, wherein each said undesired operating condition is an overvoltage condition.

* * * * *